(12) United States Patent
Richardson (10) Patent No.: US 11,605,993 B2
(45) Date of Patent: Mar. 14, 2023

(54) ROTARY MOTORS INCORPORATING FLEXIBLE PRINTED CIRCUIT BOARDS

(71) Applicant: Superior Essex Inc., Atlanta, GA (US)

(72) Inventor: Christopher Paul Richardson, Fort Wayne, IN (US)

(73) Assignee: Superior Essex Inc., Atlanta, GA (US)

( * ) Notice: Subject to any disclaimer, the term of this patent is extended or adjusted under 35 U.S.C. 154(b) by 440 days.

(21) Appl. No.: 16/814,440

(22) Filed: Mar. 10, 2020

(65) Prior Publication Data

US 2020/0303982 A1 Sep. 24, 2020

Related U.S. Application Data

(60) Provisional application No. 62/822,469, filed on Mar. 22, 2019.

(51) Int. Cl.
*H02K 3/26* (2006.01)
*H05K 1/02* (2006.01)
*H05K 1/16* (2006.01)

(52) U.S. Cl.
CPC ............. *H02K 3/26* (2013.01); *H05K 1/0277* (2013.01); *H05K 1/0296* (2013.01); *H05K 1/165* (2013.01); *H02K 2203/03* (2013.01)

(58) Field of Classification Search
CPC ............... H02K 2211/03; H02K 3/522; H02K 2203/03; H05K 1/118; H02H 5/225
See application file for complete search history.

(56) References Cited

U.S. PATENT DOCUMENTS

| 4,645,961 A | 2/1987 | Malsky |
| 4,665,331 A | 5/1987 | Sudo et al. |
| 2002/0117909 A1* | 8/2002 | Gomyo ................. H02K 3/522 310/67 R |
| 2006/0055272 A1* | 3/2006 | Lee ........................ H02K 1/146 310/179 |
| 2006/0285247 A1* | 12/2006 | Tamaoka ........... G11B 19/2009 360/99.08 |
| 2010/0007230 A1 | 1/2010 | Suzuki et al. |
| 2013/0009511 A1 | 1/2013 | Dieleman |
| 2015/0145358 A1* | 5/2015 | Cho ....................... H02K 3/522 310/71 |
| 2016/0302300 A1* | 10/2016 | Shashkov ............ H05K 1/0306 |

OTHER PUBLICATIONS

Notification of Transmittal of the International Search Report and the Written Opinion of the International Searching Authority, or the Declaration for PCT/US2020/021857, dated Jun. 9, 2020, 9 Pages.

* cited by examiner

*Primary Examiner* — Paresh Paghadal (57) ABSTRACT

Rotary motors incorporating flexible printed circuit boards are described. A motor may include a stator assembly and a rotor assembly co-radially arranged with the stator assembly and configured to rotate relative to the stator assembly. At least one of the stator assembly and the rotor assembly may include a flexible printed circuit board having a base layer and a plurality of conductive elements formed on the base layer.

18 Claims, 9 Drawing Sheets

ROTARY MOTORS INCORPORATING FLEXIBLE PRINTED CIRCUIT BOARDS

CROSS-REFERENCE TO RELATED APPLICATION

This application claims priority to U.S. Provisional Application No. 62/822,469, filed Mar. 22, 2019 and entitled "Rotary Motors Incorporating Flexible Printed Circuit Boards," the contents of which is incorporated by reference herein in its entirety.

TECHNICAL FIELD

Embodiments of the disclosure relate generally to rotary motors and, more particularly, to rotary motors that incorporate windings formed on flexible printed circuit boards.

BACKGROUND

Rotary motors and radial flux machines are utilized in a wide variety of applications. A rotary motor typically includes a rotor assembly and a stator assembly arranged in a co-radial or coaxial configuration. In traditional in-runner designs, a rotor assembly rotates or revolves inside of a stator assembly. In out runner or external rotor designs, a rotor assembly rotates or revolves around a stator assembly. Additionally, in many motor designs, the stator and/or rotor assembly typically include windings, bars, rods, or other components that are used to produce electrical torque as the rotor assembly rotates.

In conventional motor designs, windings are typically formed by positioning magnet wire or similar conductors into slots in a motor component. For example, wire windings in a stator assembly are often formed by inserting wire into slots formed around a periphery of the stator assembly. These conventional techniques for forming windings typically require winding wire to be cut and shaped, which increases costs and can lead to faults in the wire. Additionally, these conventional techniques can be capital intensive and can increase manufacturing time. Accordingly, there is an opportunity for improved rotary motors and improved motor formation techniques. In particularly, there is an opportunity for improved rotary motors that incorporate windings formed on flexible printed circuit boards.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items; however, various embodiments may utilize elements and/or components other than those illustrated in the figures. Additionally, the drawings are provided to illustrate example embodiments described herein and are not intended to limit the scope of the disclosure.

DETAILED DESCRIPTION

Various embodiments of the present disclosure are directed to rotary motors and methods for forming rotary motors. A rotary motor may include a stator assembly and a rotor assembly. In certain embodiments, the stator assembly and the rotor assembly may be co-radially arranged relative to one another. In other words, both the stator assembly and the rotor assembly may exist within the same plane that is perpendicular to the axis of rotation on which the rotor assembly rotates. Additionally, in certain embodiments, the rotor assembly may be positioned inside the stator assembly, and the rotor assembly may revolve or rotate within the stator assembly. In other embodiments, the rotor assembly may be positioned outside or around the rotor assembly. In other words, the rotary motor may include an out runner design in which the rotor assembly revolves or rotates around the stator assembly. Additionally, according to an aspect of the disclosure, the rotary motor may include at least one flexible printed circuit board ("PCB") having windings, bars, rods, or other conductive components formed therein that facilitate generation of electrical torque as the rotor assembly revolves relative to the stator assembly.

A flexible PCB may include a suitable base or substrate layer on which windings, rods, bars, or other suitable conductors can be formed. The flexible PCB may be wrapped, rolled, curled, or otherwise manipulated into a stator assembly or a rotor assembly within a motor. A PCB may be formed with a wide variety of suitable constructions that permits the PCB and conductors formed thereon to be incorporated into a motor assembly. For example, a PCB may be formed from one or more suitable materials (e.g., polyamide imide, polyimide, etc.) and/or combinations of materials that result in the PCB being flexible. As another example, the PCB may include any suitable number of flexible sections (e.g., sections formed from flexible materials, etc.) in combination with other sections (e.g., relatively rigid or inflexible sections) that permit the overall PCB to be flexible such that it may be wrapped or otherwise manipulated into a stator assembly or other motor component. In other words, selective portions of the PCB may be formed from flexible materials. As yet another example, a PCB may be formed from a plurality of sections that are connected or joined by suitable hinges or other physical attachment devices that result in the overall PCB being flexible. A wide variety of other suitable constructions may be utilized to form a flexible PCB.

A wide variety of suitable conductive elements, such as windings or other conductor arrangements (e.g., rods, bars, etc.), may be formed on a PCB as desired in various embodiments. These conductive elements may be arranged in a wide variety of suitable patterns and/or configurations to result in a desired motor type and/or design when the PCB is incorporated into a rotary motor. In certain embodiments, conductive elements may be formed on a single substrate layer of a PCB. In other embodiments, a PCB may include a plurality of layers and conductive elements may be formed on more than one layer of the PCB. As desired, conductive elements may be selectively formed on a single side or on both sides of a PCB layer.

In certain embodiments, a rotary motor may incorporate one or more laminated structures that define slots into which conductive elements (e.g., windings, etc.) are positioned. For example, a stator or rotor assembly may include a laminated slot structure (e.g., an electrical steel structure, lamination steel structure, etc.) that defines slots or channels into which conductive elements are positioned. In certain embodiments, a laminated structure may be formed from a plurality of sections that are stacked on one another. A PCB may be wrapped, curled, or otherwise manipulated around or within a laminated structure such that the conductive elements are positioned within the slots. As desired, gaps or holes may be formed through the PCB in order to facilitate alignment of conductive elements within the slots of the laminated structure. For example, teeth of the laminated structure that define the slots may extend through the gaps or holes in the PCB.

A wide variety of suitable methods and/or techniques may be utilized as desired to incorporate a flexible PCB into a rotary motor. In certain embodiments, the flexible PCB may be curled, wrapped, or otherwise manipulated around or within a preformed motor assembly (e.g., a laminated structure, etc.). In other embodiments, a flexible PCB may be positioned adjacent to a rollable or foldable motor component (e.g., a foldable stator component, etc.) such that conductors on the PCB are aligned into slots of the foldable motor component. The combined motor component and flexible PCB may then be rolled, curled, folded, or otherwise manipulated into a desired shape that may be incorporated into a motor assembly.

As a result of incorporating flexible PCBs into rotary motors, the cost of the rotary motors may be reduced relative to conventional designs. Winding and/or other conductor configurations may be formed on a flexible PCB at a reduced cost relative to that required to cut, bend, and/or otherwise shape traditional magnet wire used to form motor windings. Additionally, overall production time may be decreased while reducing equipment cost necessary for motor construction. Further, wire and conductor faults that result from conventional cutting and bending of magnet wire may be reduced.

Embodiments of the disclosure now will be described more fully hereinafter with reference to the accompanying drawings, in which certain embodiments of the disclosure are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Flexible printed circuit boards ("PCBs") that incorporate windings and/or other conductors (e.g., bars, rods, etc.) may be utilized in conjunction with a wide variety of different types of rotary motors and/or other electrical machine designs. For example, embodiments of the disclosure may be applicable for use in any motor or electrical machine having an armature component and a field component that revolve or rotate in a co-radial relationship and/or a coaxial relationship with one another. In other words, an armature and field component may be positioned about an axis of rotation such that each of the armature and field components are present within the same plane that is perpendicular to the axis of rotation. Regardless of whether a motor or electric machine is an alternating current ("AC") or a direct current ("DC") machine, an armature component or armature may be a component of the electric machine in which an alternating field occurs. For example, the armature may conduct an alternating current. The field component or field may be a component of the electric machine that generates a magnetic field. In various rotating electric machines, the armature may be embodied as either the rotor or the stator. Similarly, the field may be embodied as either the rotor or the stator. Accordingly, certain motors or electric machines may include a rotor and a stator that are arranged co-axially and/or co-radially to one another, and a flexible PCB may be incorporated into at least one of the rotor and/or stator.

Examples of suitable motors that may incorporate flexible PCBs include, but are not limited to, radial flux motors, rotary flux motors, induction motors, asynchronous motors, permanent magnet motors, brushless field excitations, synchronous reluctance motors, wound field motors, synchronous motors, stepper motors, direct current ("DC") motors, and/or brushless DC motors. In certain embodiments, a motor may be formed with an inrunner design. In other words, a rotor component of a motor may rotate or revolve inside a stator component. In other embodiments, a motor may be formed with an out runner design. In other words, a rotor component of the motor may rotate or revolve around a stator component. Additionally, embodiments of the disclosure may include motors in which a flux is generated perpendicular to a direction of rotation.

In yet other embodiments, flexible PCBs that incorporate conductive components may be incorporated into non-rotary motors. For example, flexible printed circuit board may be incorporated into axial flux machines and/or linear motors. It will be appreciated that embodiments of the disclosure may be applicable to these other types of motors. Additionally, regardless of the type of motor utilized, a motor may be formed with any suitable number of phases (e.g., a single phase motor, a three-phase motor), any suitable number of poles, any suitable pole pitch, and/or a wide variety of other desired characteristics. One or more windings or other conductive components incorporated into a motor may also be formed in accordance with a wide variety of suitable patterns and/or configurations.

Figure 1:
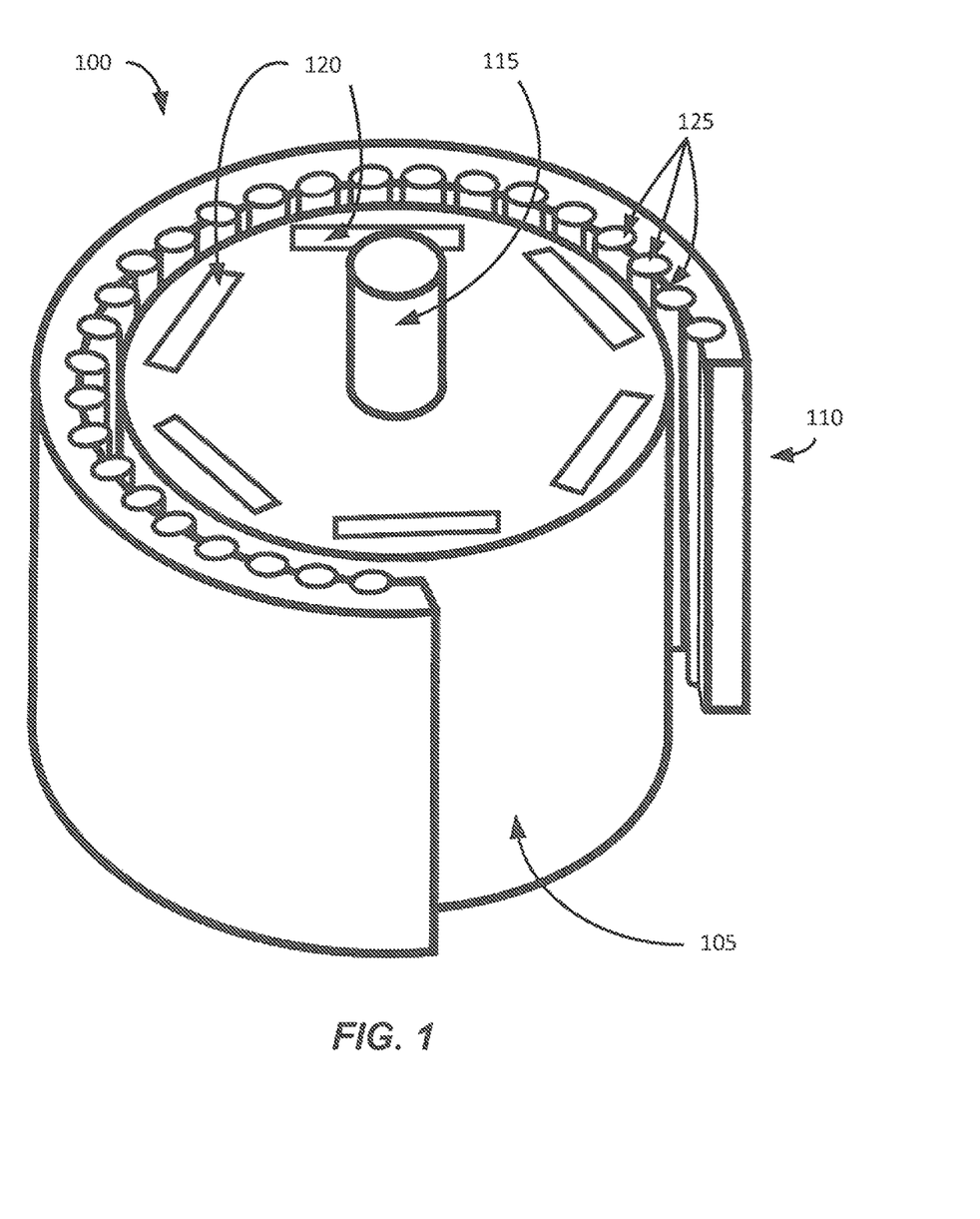
FIGS. 1 and 2 depict perspective views of example rotary motors that may incorporate windings or other conductive elements formed on one or more flexible printed circuit boards, according to illustrative embodiments of the disclosure.
Figure 2:
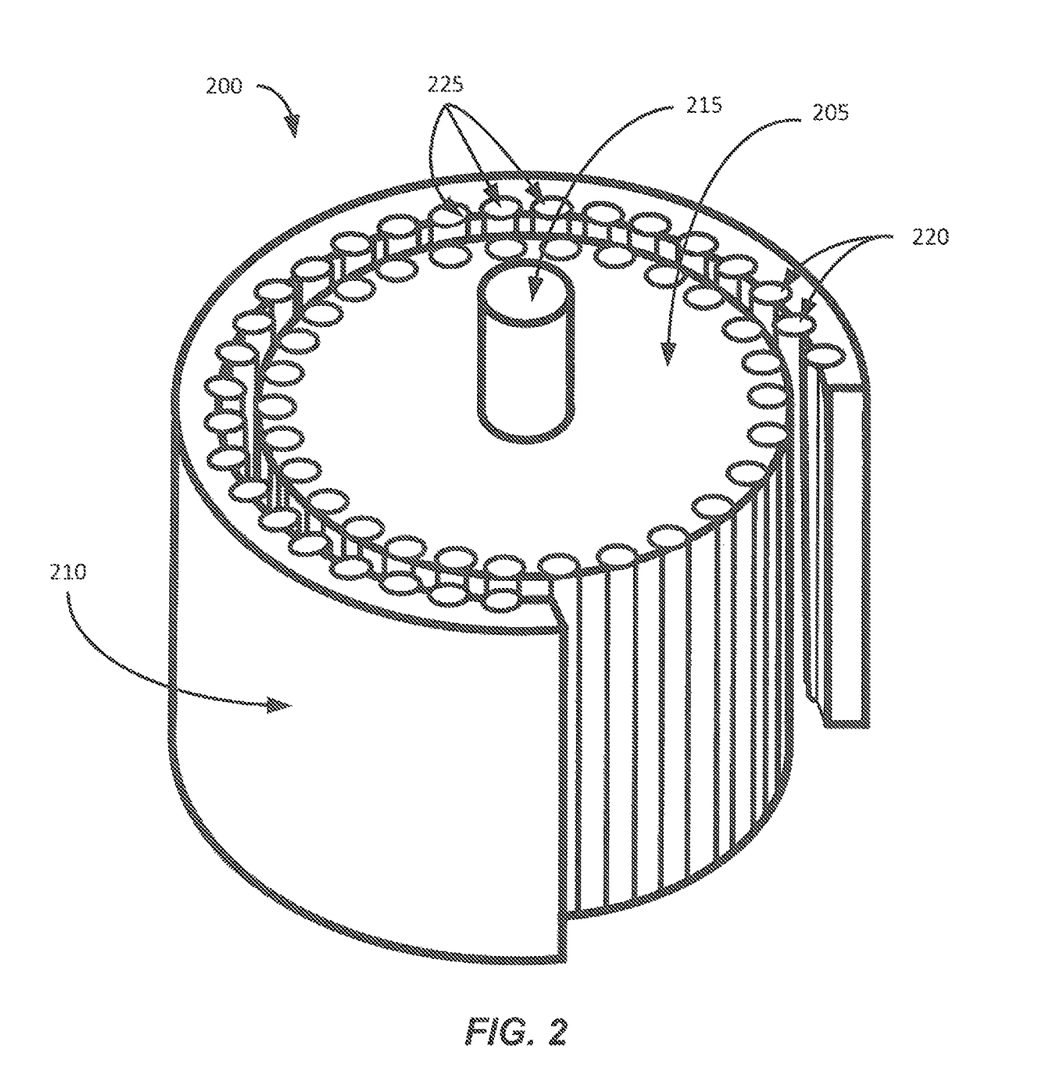

FIGS. 1 and 2 depict perspective views of example rotary motors 100, 200 that may incorporate conductive components formed on one or more flexible printed circuit boards, according to illustrative embodiments of the disclosure. Turning first to FIG. 1, an example permanent magnet motor 100 is illustrated. The permanent magnet motor 100 may include a rotor assembly 105 that revolves or rotates within a stator assembly 110 around a suitable shaft 115. In other embodiments, a permanent magnet motor 100 may be formed with an out-runner design, and the rotor assembly 105 may revolve around the stator assembly 110. The rotor assembly may include permanent magnets 120 that interact with the stator assembly 110 in order to create a constant magnetic field. The stator assembly 110 may include windings 125 or other conductive elements that are connected to a power supply in order to produce a rotating magnetic field. In one example embodiment, the windings 125 of the stator assembly 110 may be formed on one or more flexible PCBs incorporated into the stator assembly 110.

FIG. 2 illustrates an example induction motor 200 that may incorporate one or more flexible PCBs. The induction motor 200 may include a rotor assembly 205 that rotates or revolves within a stator assembly 210 around a suitable shaft 215. In other embodiments, the induction motor 200 may be formed with an out-runner design, and the rotor assembly 205 may revolve around the stator assembly 210 via one or more suitable shafts. Regardless of whether the induction motor 200 is formed with an inrunner or out-runner design, the stator assembly 210 may include windings 220 that create a magnetic field when alternating current power is supplied. As desired in various embodiments, the windings 220 of the stator assembly 210 may be formed on one or more flexible PCBs incorporated into the stator assembly 210. Additionally, the rotor assembly 205 may include windings, bars, rods, or other conductors 225 that interact with the stator assembly 210 to produce electrical torque. For example, the rotor assembly 205 may be formed as a wound-rotor assembly that includes windings connected through slip rings to external resistance. As another example, the rotor assembly 205 may be formed as a squirrel cage rotor assembly that includes bars or conductors embedded in its surface. As desired in various embodiments, the windings, bars, and/or other conductive elements of the rotor assembly 205 may be formed on one or more flexible PCBs incorporated into the rotor assembly 205.

The motors 100, 200 illustrated in FIGS. 1 and 2 are provided by way of non-limiting example only. A wide variety of other types of motors may be utilized in various embodiments of the disclosure provided that at least one motor component (e.g., a stator assembly, a rotor assembly, etc.) incorporates at least one PCB having conductive elements formed or positioned thereon. These other motors may include more or less components than those described above with reference to the example motors 100, 200 of FIGS. 1 and 2.

Figure 3A:
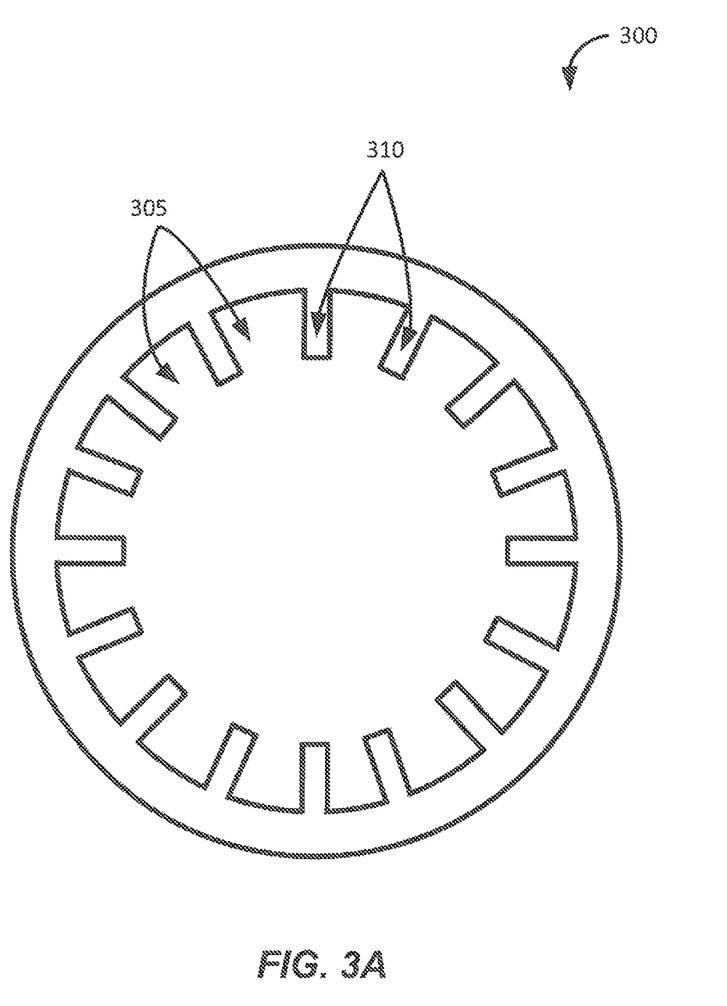
FIGS. 3A-3B depict cross-sectional views of example laminated structures that may be incorporated into rotary motors in order to define slots into which conductive elements can be inserted, according to illustrative embodiments of the disclosure.
Figure 3B:
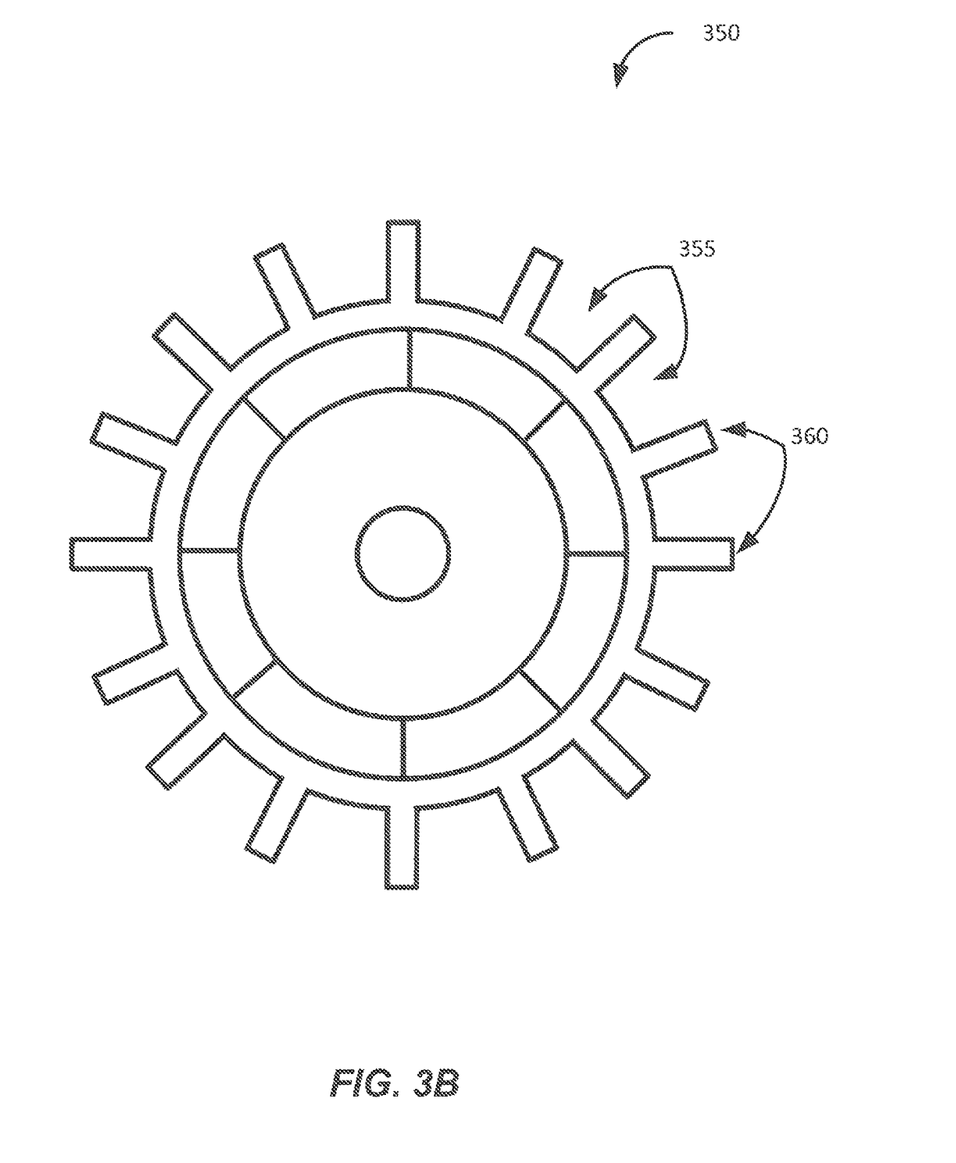

In certain embodiments, a motor may include one or more laminated structures, laminated cores, or slot structures into which windings, rods, bars, and/or other conductive elements may be positioned. A laminated structure typically includes a plurality of slots into which respective conductive elements may be positioned. A few example laminated structures that may be utilized in conjunction with a motor are illustrated in FIGS. 3A-3B. In particular, FIG. 3A illustrates a first example laminated structure 300 that may be incorporated into an external motor assembly (e.g., an external stator assembly, an out runner rotor assembly etc.). FIG. 3B illustrates a second example laminated structure 350 that may be incorporated into an internal motor assembly (e.g., an inrunner rotor assembly, an internal stator assembly, etc.).

A laminated structure (generally referred to as laminated structure 300) may be formed from a wide variety of suitable materials and/or combinations of materials. In certain embodiments, the laminated structure 300 may be formed from electrical steel, lamination steel, silicon electrical steel, or silicon steel. Electrical steel may be tailored to produce specific properties within a motor component (e.g., a stator assembly, a rotor assembly, etc.), such as a small hysteresis area resulting in low power loss per cycle, low core loss, and/or high permeability.

In certain embodiments, a laminated structure 300 may be formed from a plurality of sections (e.g., sections of electrical steel, etc.) or plates that are stacked on one another along a longitudinal direction of a motor (e.g., a direction that is parallel to or aligned with an axis around which the rotor assembly revolves). Any number of sections may be utilized to form a laminated structure 300 as desired in various embodiments of the disclosure. Additionally, each section may have any suitable thickness, such as a thickness of approximately 0.078 inches (approximately 2 mm) or less. As desired, one or more of the sections may be coated in order to increase electrical resistance between laminations or sections, reduce eddy currents, and/or to provide resistance to corrosion or rust. A wide variety of suitable coatings may be utilized as desired.

Further, a laminated structure 300 may include a plurality of slots 305 into which windings and/or other conductive elements may be positioned. For example, as shown in FIG. 3A, a laminated structure 300 may include a plurality of slots 305 positioned along or proximate to an inner periphery of the laminated structure 300 that defines an internal channel into which another motor component is positioned. The slots 305 may be separated and/or defined by teeth 310 that extend outwardly from an inner surface of the laminated structure 300 into the channel. As another example, as shown in FIG. 3B, a laminated structure 350 may include a plurality of slots 355 positioned along or proximate to an outer periphery of laminated structure 350 and defined by corresponding teeth 360. Each slot (generally referred to as slot 305) may be configured to receive a suitable wire, winding, or other conductive element. In certain embodiments, each slot 305 may extend along or parallel to a longitudinal direction of a motor. In other embodiments, one or more slots 305 may be formed at one or more desired angles relative to the longitudinal direction. Any number of slots 305 may be formed in a laminated structure 300 as desired in various embodiments. In certain embodiments, a number of slots 305 and corresponding conductive elements may be based at least in part upon desired motor characteristics, such as a desired pole pitch and/or winding configuration.

In certain embodiments, a laminated structure 300 may be formed with a predetermined final shape. For example, a laminated structure 300 may be formed with relatively circular cross-sectional shape. In other embodiments, a laminated structure 300 may be formed as a foldable, rollable, or relatively flexible structure. For example, a laminated structure 300 may be formed as a foldable stator structure or a foldable stator construction. As another example, a laminated structure 300 may be formed as a foldable rotor structure or a foldable rotor construction. In this regard, a laminated structure 300 may be folded with, rolled up with, or otherwise manipulated in conjunction with a flexible PCB as described in greater detail below with reference to FIG. 6. A wide variety of suitable techniques may be utilized as desired to form or shape a laminated structure as will be appreciated by those of ordinary skill in the art.

The laminated structures 300, 350 illustrated in FIGS. 3A and 3B are provided by way of non-limiting example only. A wide variety of other types of laminated structures or laminated cores may be utilized in various embodiments of the disclosure. These other laminated structures may include more or less components than those described above and/or illustrated with reference to the example structures 300, 350 of FIGS. 3A-3B. In yet other embodiments, a rotary motor or motor component may be formed without a laminated structure.

According to an aspect of the disclosure, a rotary motor may include at least one flexible printed circuit board ("PCB") having windings, bars, rods, and/or other conductive elements formed therein. For example, the motors 100, 200 illustrated in FIGS. 1 and 2 may incorporate one or more flexible PCBs on which conductive elements are formed or positioned. A flexible PCB may include a suitable base or substrate layer on which conductive elements can be formed. The flexible PCB may be wrapped, rolled, curled, and/or otherwise manipulated or positioned within a motor component, such as a stator assembly or a rotor assembly. The conductive elements formed on the flexible PCB may be utilized by the motor as an alternative to conventional windings and/or other conductors that are inserted into slots and/or embedded into motor components. As a result, the cost of a rotary motor may be reduced while simplifying manufacturing techniques and/or reducing defects.

According to an aspect of the disclosure, a flexible PCB, flexible circuit, or flexible assembly may be a suitable component that may be incorporated into a motor assembly while being sufficiently flexible to conform to a desired shape within the motor assembly. In certain embodiments, a flexible PCB may be a PCB that is rollable or bendable. In other embodiments, a flexible PCB may be a PCB having a desired bend radius that makes it suitable for use in a rotary motor. For example, a PCB may have a bend radius of approximately 0.5, 0.75, 1.0, 1.25, 1.5, 1.75, 2.0, 3.0, 4.0, 5.0, 6.0, 8.0, 10.0, 12.0, 15.0, 18.0, 20.0, 25.0, 30.0, 40.0, 50.0, 60.0, 75.0, or 100 inches, a bend radius included in a range between any two of the above values (e.g., a bend radius between 1.0 and 20.0 inches, etc.), or a bend radius included in a range bounded on a maximum end by one of the above values (e.g., a bend radius of less than 1.0, 2.0, 5.0, 10.0, or 20.0 inches, etc.). In other embodiments, a flexible PCB may be a PCB having a desired flexural modulus or bending modulus. For example, a flexible PCB may have a flexural modulus of approximately 8,000, 9,000, 9,500, 10,000, 10,500, 11,000, 11,500, or 12,000 MPa, a flexural modulus included in a range between any two of the above values, or a flexural modulus included in a range bounded on a minimum end by one of the above values (e.g., a flexural modulus greater than approximately 10,000, etc.). In certain embodiments, the bend radius for a PCB can be based on desired dimensions for a motor or electric machine.

Figure 4A:
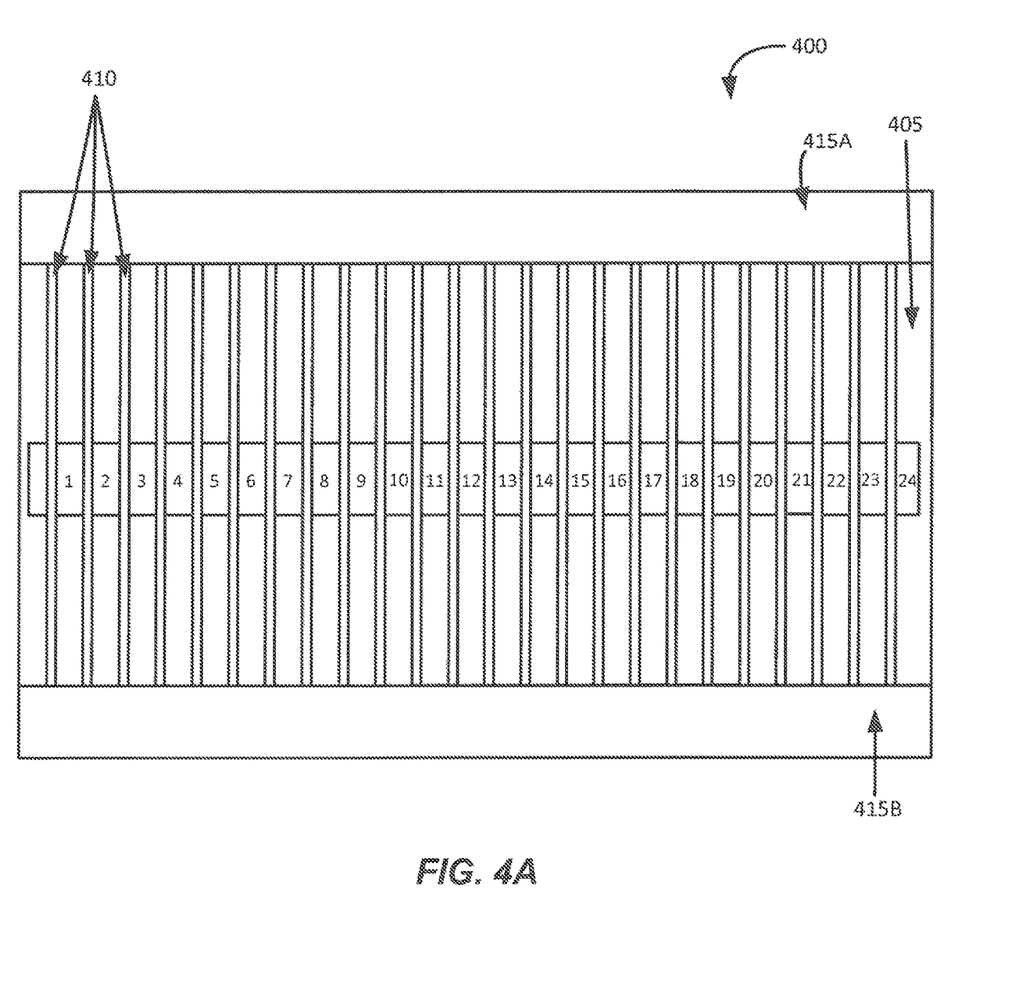
FIGS. 4A-4B depict top level views of example printed circuit boards on which conductive elements can be formed, according to illustrative embodiments of the disclosure.
Figure 4B:
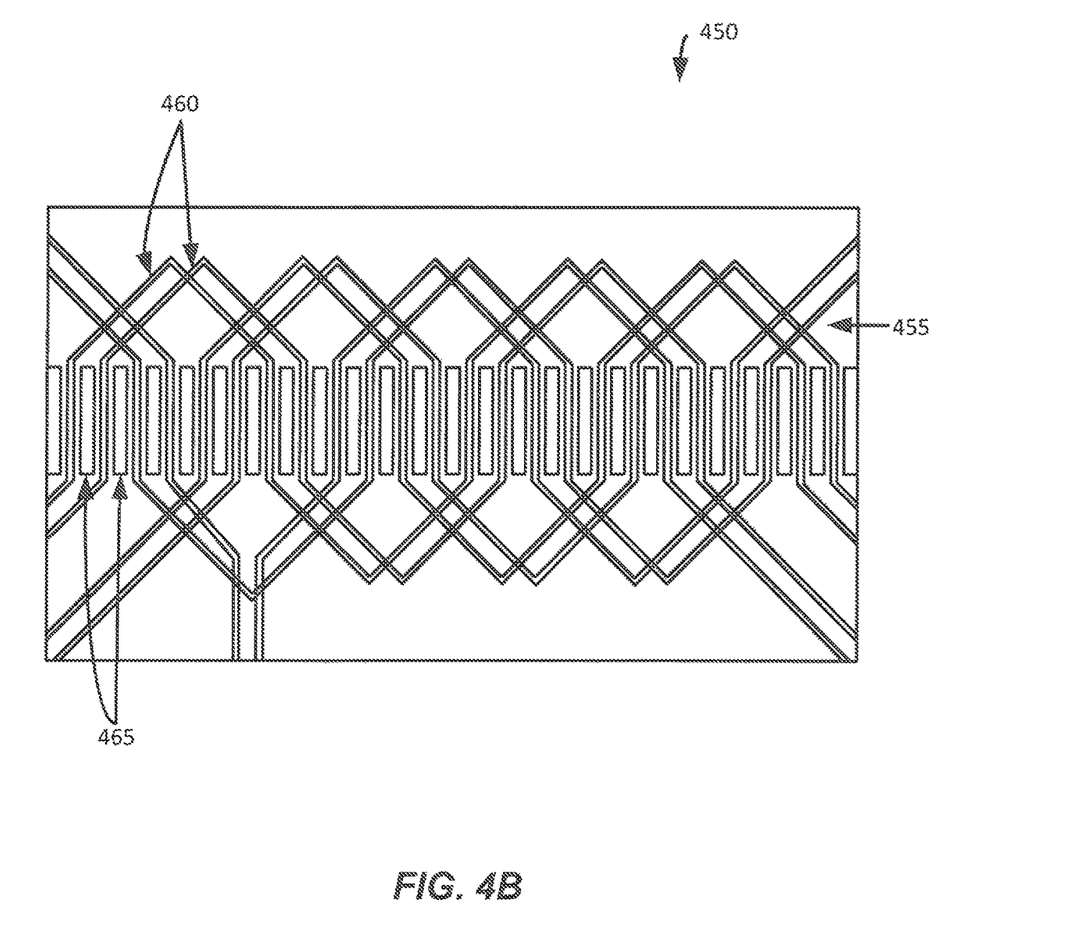

FIGS. 4A-4B depict top level views of example printed circuit boards 400, 450 that may be incorporated into a rotary motor, according to illustrative embodiments of the disclosure. Both example PCBs 400, 450 include conductive elements formed on one or more suitable substrate layers; however, the PCB 450 of FIG. 4B illustrates one example of end turns that can be formed on the PCB between the conductors of a winding configuration. The PCBs 400, 450 are described in greater detail below with reference to the PCB 400 of FIG. 4A. It will be appreciated that the PCB 450 of FIG. 4B may include similar components as the PCB 400 of FIG. 4A.

With reference to FIG. 4A, a flexible PCB 400 may include one or more base or substrate layers 405 on which conductive elements may be formed or otherwise positioned. A base layer 405 may be formed with a wide variety of suitable constructions as desired in various embodiments provided that the resulting PCB is flexible and suitable for incorporation into a motor assembly. In certain embodiments, a base layer 405 may be formed from one or more suitable materials (e.g., polyamide imide, polyimide, other flexible materials, etc.) and/or combinations of materials that result in the PCB being flexible. In other embodiments, a base layer 405 may include a combination of flexible sections (e.g., sections formed from flexible materials, etc.) and other sections (e.g., relatively rigid or inflexible sections). The flexible sections may permit the PCB to be wrapped, rolled, curled, or otherwise manipulated for incorporation into a motor assembly. In other words, selective portions of the base layer 405 may be formed from flexible materials. In yet other embodiments, a base layer 405 may be formed from a plurality of sections that are connected or joined together by suitable hinges or other physical attachment devices that result in the overall PCB being flexible. A few non-limiting examples of PCB layer and/or material constructions are described in greater detail below with reference to FIGS. 5A-5D. A wide variety of other suitable constructions may be utilized to form a base layer 405 and/or a flexible PCB.

The base layer 405 may be formed from a wide variety of suitable materials and/or combinations of materials. Examples of suitable materials that may be utilized to form a base layer 405 (or flexible sections of a base layer 405) include, but are not limited to, polyimide, polyamide imide, polyester, polyethylene naphthalate, polyetherimide, and/or various copolymers. In certain embodiments, a base layer 405 may be formed from Kapton or UPILEX material. In the event that a base layer 405 incorporates one or more additional sections of relatively rigid or inflexible material (e.g., sections of rigid material positioned between sections of flexible material, etc.), the additional sections may be formed from a wide variety of suitable materials and/or combinations of materials. For example, the sections may be formed from conventional materials utilized to form inflexible PCBs including, but not limited to, phenolic paper, fiberglass, insulated metallic materials, etc.

Additionally, any number of base layers or substrate layers may be incorporated into a PCB 400 as desired. In certain embodiments, a number of base layers incorporated into a PCB 400 may be based at least in part upon a desired winding or conductor configuration. For example, in order to form certain three-phase winding configurations, a plurality of base layers may be utilized to prevent shorting of conductor windings. In various embodiments, one, two, three, four, or any other suitable number of base layers may be incorporated into a PCB 400. In the event that multiple base layers are utilized, in certain embodiments, the base layers may be formed from the same materials and/or with the same construction. In other embodiments, at least two base layers may be formed with different materials.

Further, each base layer may be formed with a wide variety of suitable dimensions, such as any suitable length, width, cross-sectional area, cross-sectional shape, and/or thickness. In the event that a plurality of base layers are utilized in a PCB, in certain embodiments, the plurality of base layers may be formed with similar dimensions. In other embodiments, at least two base layers may be formed with one or more differing dimensions (e.g., different cross-sectional areas to accommodate different portions of a winding configuration, different thicknesses, etc.).

Additionally, in certain embodiments, any number of topcoat, bottom coat, sandwiching, or other layers may be incorporated into a PCB in order to cover conductive elements formed on a base layer. For example, a topcoat may be formed over the conductive elements of an uppermost base layer in a PCB 400 in order to provide protection and/or insulation for the conductive elements formed on the base layer. In certain embodiments, a topcoat or other sandwiching layer may be formed from similar materials as a base layer 405. In other embodiments, a topcoat or other sandwiching layer may be formed from other suitable insulating materials, such as conformal coatings, thermoplastic insulation material, and/or thermosetting insulation material.

A wide variety of suitable conductive elements 410, such as windings or other conductor arrangements (e.g., rods, bars, etc.) may be incorporated into or formed on a PCB 400 as desired in various embodiments. For example, winding and/or other conductor arrangements may be formed on one or more base layers 405 of a PCB 400. Conductive elements 410 may be formed from a wide variety of suitable materials and/or combinations of materials that may be utilized to generate an field within a motor assembly. Examples of suitable materials that may be utilized to form a winding or other conductive element on a PCB 400 include, but are not limited to, metallic materials (e.g., copper, aluminum, silver, etc.), metallic alloys, bimetals, carbon nanotubes, etc. Additionally, each conductive element may be formed with a wide variety of suitable dimensions, such as any suitable cross-sectional shape, thickness, length, width, etc. In certain embodiments, the dimensions of the various conductors incorporated into a PCB 400 may be based upon a desired winding or conductor configuration and/or operating parameters for a motor assembly.

Any number of conductive elements 410 may be incorporated into a PCB 400 as desired in various embodiments. In certain embodiments, conductive elements 410 formed on one or more base layers 405 of a PCB 400 may be arranged in a wide variety of suitable patterns and/or configurations to result in a desired motor type and/or design when the PCB is incorporated into a rotary motor. For example, conductive elements 410 may be formed with one or more suitable winding configurations. Examples of suitable winding configurations include, but are not limited to, distributed winding configurations, wave winding configurations, sinusoidal winding configurations, lap winding configurations, etc. A wide variety of other winding configurations may be utilized in other embodiments. The disclosure is not limited to any particular winding configuration, and those discussed herein are provided by way of non-limiting example only.

As desired, a winding and/or conductor configuration incorporated into a PCB 400 may result in a motor assembly having any desired number of phases, poles, pole pitches, and/or other characteristics. For example, various winding configurations can be utilized to form single phase, three-phase, and/or other types of motors. Further, various motors may be designed with any desired number of poles. This disclosure is not limited to any specific winding configuration.

FIG. 4A illustrates an example winding configuration that may be utilized in a 24 slot motor assembly, such as a three phase alternating current, four pole motor assembly. The various conductors 410 for the winding configuration are illustrated such that the conductors 410 may be aligned with the slots of a motor component (e.g., a stator assembly, a rotor assembly, a laminated structure, etc.). The PCB 400 of FIG. 4A does not illustrate end turns between the various conductors 410. It will be appreciated that any suitable end turns or connections between the conductors may be formed on the base layer(s) 405 of the PCB 400 as desired in various embodiments. For example, end turns may be formed in a convenient manner in the areas 415A, 415B above and below the conductors 410 in order to result in a desired winding configuration. In operation, the PCB 400 may carry fundamental current in each of the conductors 410 aligned in respective slots, and the end currents may be carried by the end turns.

FIG. 4B illustrates another example winding configuration that may be utilized in a 24 slot motor assembly, such as a three phase alternating current, four pole motor assembly. Similar to the PCB 400 of FIG. 4A, the PCB 450 of FIG. 4B includes one or more base layers 455 and conductive elements 460 (e.g., windings, etc.) formed on the base layer(s) 455. However, FIG. 4B also shows one non-limiting example of end turns that may be formed by and between the conductive elements in order to provide a wave winding configuration. It will be appreciated that a wide variety of other suitable winding configurations may be formed as desired. Additionally, end turns for a wave winding may be formed in a wide variety of arrangements other than that illustrated in FIG. 4B.

In addition to winding configurations, a wide variety of other suitable conductor configurations may be incorporated into a PCB 400 as desired. For example, conductors may be formed on one or more base layers 405 to result in a suitable squirrel cage that may be incorporated into a rotor assembly. For example, the conductors incorporated into a PCB 400 may be utilized as bars or rods in a squirrel cage rotor assembly. In certain embodiments, bars may be formed to extend along or parallel to a longitudinal direction of a motor component. In other embodiments, one or more bars may be formed at one or more desired angles (e.g., skew angles) relative to the longitudinal direction. As desired, the bars may be connected in parallel to one another at opposite ends (i.e., at a top and a bottom end) of a PCB 400. For example, rotor rings may be formed at opposite ends of a PCB 400. A wide variety of other suitable conductor configurations and arrangements may be incorporated into a PCB 400 as desired.

In certain embodiments, conductive elements 410 may be formed on a single base or substrate layer 405 of a PCB 400. In other embodiments, a PCB may include a plurality of base layers and conductive elements 410 may be formed on more than one layer of the PCB. As desired, conductive elements 410 may be selectively formed on a single side or on both sides of a base layer 405. For example, first conductive elements may be formed on a first side of a base layer 405, and second conductive elements may be formed on a second side of the base layer 405.

A wide variety of suitable methods and/or techniques may be utilized to form conductive elements 410 on a base layer 405. For example, in certain embodiments, conductive material may be deposited (e.g., liquid metal deposited, vapor deposited, extruded, etc.) on a base layer 405. In other embodiments, conductive material may be applied via additive manufacturing. In other embodiments, a conductive layer may be formed on or adhered to a base layer 405, and the conductive layer may be etched in order to form windings 410 and/or other conductors. In yet other embodiments, conductive elements 410 may be welded, heat fused, adhered, or otherwise joined to a base layer 405.

In certain embodiments, gaps may be formed between any number of the conductive elements 410 incorporated into a PCB 400. The gaps may align with one or more teeth that define the slots into which the conductive elements 410 are inserted within a motor assembly. For example, when a flexible PCB 400 is wrapped, curled, rolled, or otherwise incorporated into a motor component (e.g., a stator assembly, a rotor assembly, etc.), the conductive elements 410 may be aligned or positioned within respective slots. Teeth that define the slots may extend through the gaps in the PCB 400 to facilitate positioning of the conductive elements 410 within the slots. End turns or connections between conductive elements 410 may be positioned above and/or below the slots. In addition to facilitating the alignment of conductive elements 410 into respective slots, gaps may also enhance the flexibility of a PCB 400.

The PCB 450 of FIG. 4B illustrates example gaps 465 that may be formed through the PCB 450 between various windings 460. Each gap (generally referred to as gap 465) may be formed with a wide variety of suitable dimensions, such as any suitable length, width, cross-sectional shape, and/or cross-sectional area. As shown, the gaps 465 do not extend across an entire dimension (e.g., a width dimension) of the PCB 450. For example, the gaps 465 may be formed to correspond to the length of the corresponding slots within a motor component. As a result, end turns can be formed above and/or below the gaps 465.

In certain embodiments, a PCB 400 and/or various base layers 405 of a PCB 400 may be formed or produced with desired gaps. Conductive elements 410 may then be formed or positioned on the PCB 400 between desired gaps. In other embodiments, a PCB 400 may be formed without gaps, and gaps may be subsequently formed through the PCB 400 via any suitable techniques, such as punching, stamping, laser cutting, etc. As desired, gaps may be formed through a PCB 400 either prior to or subsequent to the formation or positioning of conductive elements.

As set forth above, a PCB (e.g., the PCBs 400, 450 illustrated in FIGS. 4A and 4B) may be formed with a wide variety of suitable material and/or layer constructions. A few example constructions will now be described with reference to FIGS. 5A-5D, which depict cross-sectional views of example printed circuit boards. Any of these example constructions, as well as other suitable constructions, may be utilized to form a PCB that may be incorporated into a rotary motor or other motor assembly.

Figure 5A:
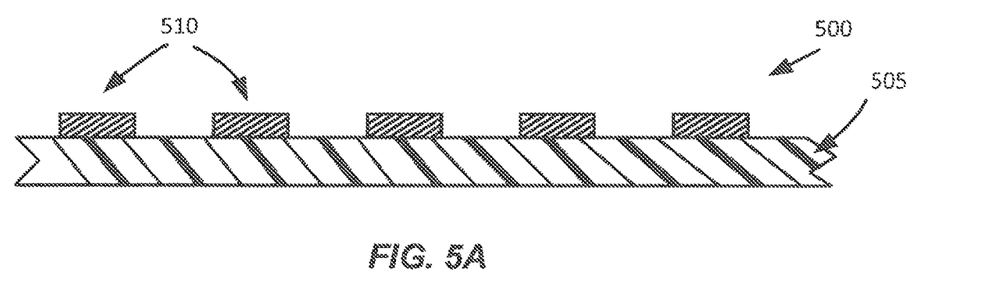
FIGS. 5A-5D depict cross-sectional views of example printed circuit boards on which conductive elements can be formed, according to illustrative embodiments of the disclosure.

Turning now to FIG. 5A, a first example PCB construction 500 is illustrated. The PCB 500 may include a single base layer 505, and conductive elements 510 may be formed on the base layer 505. The base layer 505 may be formed from one or more suitable materials and/or combinations of materials that result in the PCB 500 having a desired flexibility. As shown, the conductive elements may be formed on a single surface of the base layer 505 in certain embodiments. In other embodiments, conductive elements may be formed on opposite surfaces of the base layer 505.

Figure 5B:
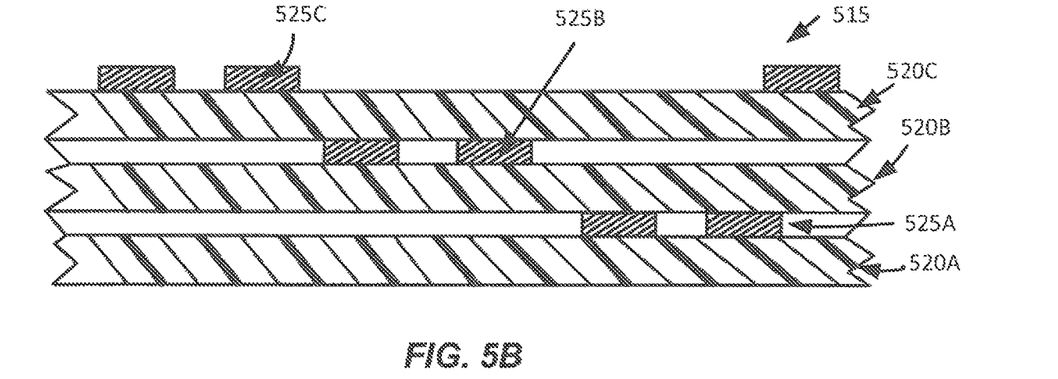

FIG. 5B illustrates another example PCB construction 515. The PCB 515 may include a plurality of base layers 520A-C on which respective conductive elements 525A-C may be formed. Three base layers 520A-C are illustrated in FIG. 5B. In one example construction, the various windings associated with a three phase motor may be formed on the three base layers 520A-C. For example, the windings for a first phase may be formed on a first base layer, the windings for a second phase may be formed on a second base layer, and the windings for a third phase may be formed on a third base layer. Alternatively, various windings may be formed on opposite sides of one or more of a plurality of base layers. Although three base layers 520A-C are illustrated in FIG. 5B, any suitable number of base layers may be incorporated into a PCB as desired.

In a multi-phase motor, windings associated with any number of phases may be formed on a particular base layer as desired. For example, windings associated with all three phases of a three-phase motor may be formed on a single base layer. As another example, windings may be formed on two, three, or a higher number of base layers. Indeed, a wide variety of suitable layer and/or winding configurations may be utilized in various embodiments. Further, regardless of a number of base layers incorporated into a PCB, one or more insulating and/or protective topcoats and/or bottom coats may optionally be incorporated into a PCB.

Figure 5C:
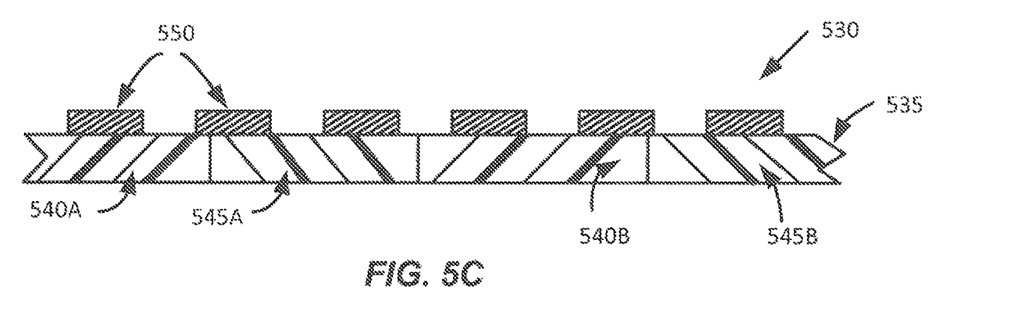

FIG. 5C illustrates another example PCB construction 530. The PCB 530 may include a base layer 535 that includes a plurality of sections of material. For example, the base layer 535 may include first sections 540A, 540B formed from first materials and second sections 545A, 545B formed from second materials different than the first materials. In certain embodiments, the first materials may be relatively flexible materials (e.g., polyimide, etc.) while the second materials are more rigid materials. The sections formed from the first material(s) may impart desired flexibility upon the PCB 530, thereby allowing the PCB 530 to be incorporated into a motor assembly. A wide variety of suitable materials and/or material combinations may be utilized to form the various sections. Additionally, the various sections may be arranged in a wide variety of suitable configurations. For example, as shown in FIG. 5C, first sections and second sections may alternate along a length of the PCB 530. Additionally, each section may be formed with a wide variety of suitable dimensions. As shown, each of the first sections and second sections may have similar dimensions (e.g., lengths, etc.). In other embodiments, different sections may be formed with one or more differing dimensions. For example, flexible sections may be formed with different lengths and/or other dimensions than relatively rigid sections. Conductive elements 550 may be formed on the base layer 535 as desired.

As desired, the PCB 530 may include a plurality of base layers, and conductive elements may be formed on any number of the base layers. Further, in certain embodiments, each base layer may be formed with a similar construction and/or from similar materials. In other embodiments, a first base layer may be formed from a first set of materials (e.g., alternating flexible and rigid sections) while a second base layer may be formed from a second set of materials (e.g., flexible materials, etc.) different than the first materials.

Figure 5D:
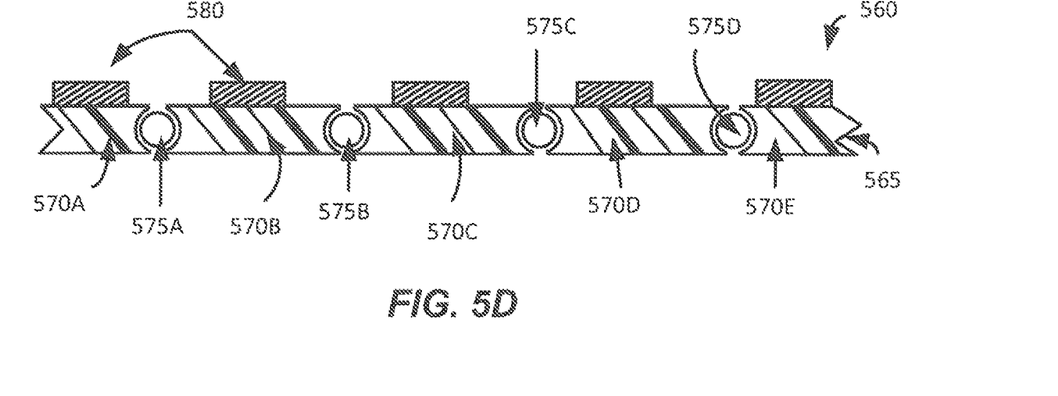

FIG. 5D illustrates another example PCB construction 560. The PCB 560 may include a base layer 565 that includes a plurality of sections 570A-E of material connected or joined by connection components 575A-D that enhance the flexibility of the PCB 560. Conductive elements 580 may be formed on the plurality of sections 570A-E as desired. In certain embodiments, each of the sections 570A-E may be formed from similar materials or combinations of materials. For example, each of the sections 570A-E may be formed from any of the materials discussed herein as being suitable for forming a PCB base or substrate layer. In other embodiments, at least two of the sections 570A-E may be formed from different materials.

A wide variety of suitable components may be utilized as connection components 575A-D as desired in various embodiments. Example connection components include, but are not limited to, hinges, other physical attachment components that permit rotation between joined sections (e.g., sections 570A and 570B, etc.), and/or a wide variety of components that are not suitable as a substrate for conductive elements but that can flexibly join two base or substrate sections (e.g., sections 570A and 570B, etc.), such as connecting bands, flexible connectors, etc.

As desired, the PCB 560 may include a plurality of base layers, and conductive elements may be formed on any number of the base layers. Further, in certain embodiments, each base layer may be formed with a similar construction and/or from similar materials. In other embodiments, a first base layer may be formed from first materials (e.g., sections joined by hinges, etc.) while a second base layer may be formed from second materials (e.g., flexible materials, etc.) different than the first materials.

The PCB constructions 500, 515, 530, 560 illustrated in FIGS. 5A and 5D are provided by way of non-limiting example only. A wide variety of other types of PCB constructions may be utilized in various embodiments of the disclosure. These other PCB constructions may include more or less components than those described above and/or illustrated with reference to the example PCBs 500, 515, 530, 560 of FIGS. 5A-5D. For example, other PCB constructions may include any suitable numbers of layers of material.

Figure 6:
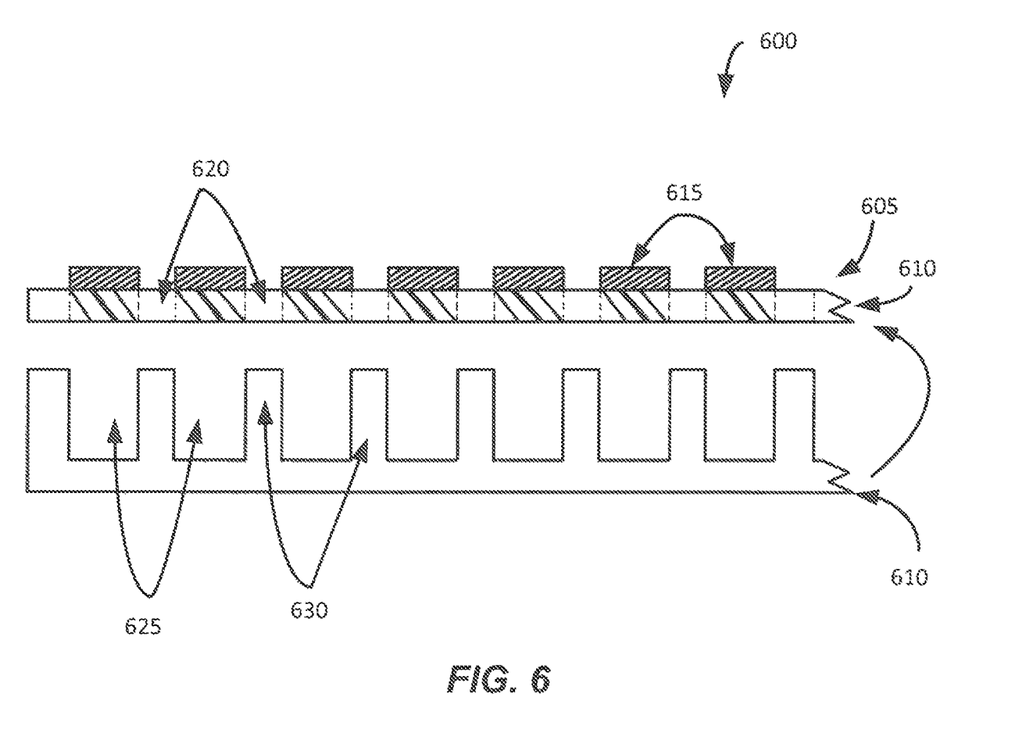
FIG. 6 depicts a cross-sectional view of a printed circuit board aligned with the slots of a laminated structure that can be incorporated into a rotary motor, according to an illustrative embodiment of the disclosure.

A wide variety of suitable methods and/or techniques may be utilized to incorporate a flexible PCB, such as any of the flexible PCBs described herein, into a motor assembly. One example technique 600 is illustrated in FIG. 6. FIG. 6 depicts a cross-sectional view of a flexible PCB 605 being aligned with a laminated structure 610 (e.g., a laminated slot structure) that will be incorporated into a motor component. The PCB 605 includes a base layer 610 and a plurality of conductive elements 615 (e.g., windings, etc.) formed on the base layer 610. Additionally, gaps 620 or holes may be formed through the base layer 610 between the conductive elements 615.

The laminated structure 610 includes a plurality of slots 625 into which windings or other conductive elements may be positioned. The slots 625 may be defined by teeth 630 that extend outwardly from a main body portion of the laminated structure 610. In certain embodiments, the laminated structure may be a flexible or foldable laminated structure, such as a foldable stator structure or a foldable rotor structure. Additionally, the laminated structure may include any desired number of sections, such as any desired number of sections that may be stacked on one another. As shown in FIG. 6, the PCB 605 may be aligned with the laminated structure 610 such that the conductive elements 615 are positioned within respective slots 625. The teeth 630 of the laminated structure 610 may extend through the gaps 620 in the PCB 605. Once aligned, the combined laminated structure 610 and PCB 605 may be rolled, curled, or otherwise manipulated in order to be incorporated into a motor assembly. For example, the combined components may be incorporated into a stator assembly or a rotor assembly of a rotary motor.

In other embodiments, a laminated structure may be formed with a desired shape for incorporation into a motor assembly. For example, a laminated structure may be formed with a cross-sectional shape that is approximately circular (or another desired shape) such that the laminated structure may be incorporated into a stator assembly or a rotor assembly. As desired, a flexible PCB, such as the PCB 605 illustrated in FIG. 6, may be wrapped, rolled, curled, folded, bent, or otherwise manipulated such that it is aligned with the laminated structure. For example, the PCB 605 may be manipulated such that conductive elements 615 are positioned within slots of the laminated structure. A wide variety of other suitable methods and/or techniques may be utilized to incorporate a flexible PCB into a motor assembly, and those described herein are provided by way of non-limiting example only.

In certain embodiments, a single PCB may be incorporated into a specific motor component. For example, a single PCB may be incorporated into a stator assembly. In other embodiments, a plurality of PCBs may be incorporated into a motor component. For example, a stacked plurality of separated PCBs may be incorporated into a stator assembly. As another example, a plurality of separate PCBs may be circumferentially spaced around a stator assembly. Indeed, any suitable number of PCBs and arrangements of PCBs may be incorporated into a motor component. Further, separate PCBs may be selectively incorporated into separate motor components. For example, a stator assembly may include a first set of one or more PCBs and a rotor assembly may include a second set of one or more PCBs.

As a result of incorporating flexible PCBs into rotary motors, the cost of the rotary motors may be reduced relative to conventional designs. Winding and/or other conductor configurations may be formed on a flexible PCB at a reduced cost relative to that required to cut, bend, and/or otherwise shape traditional magnet wire used to form motor windings. Additionally, overall production time may be decreased while reducing equipment cost necessary for motor construction. Further, wire and conductor faults that result from conventional cutting and bending of magnet wire may be reduced.

Figure 7:
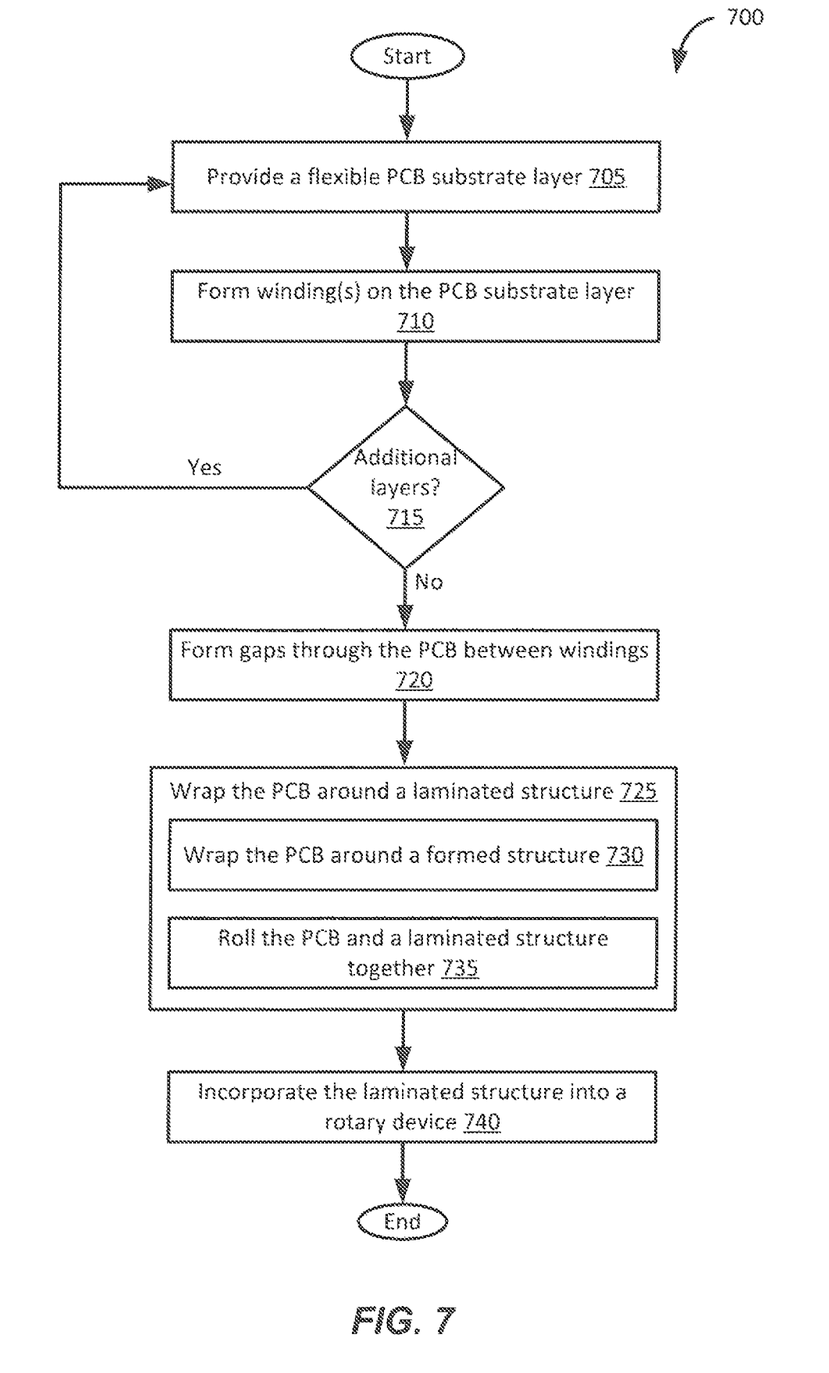
FIG. 7 depicts a flow chart of an example method for forming conductive elements on a printed circuit board and incorporating the printed circuit board into a rotary device, according to an illustrative embodiment of the disclosure.

FIG. 7 depicts a flow chart of an example method 700 for forming conductive elements on a flexible printed circuit board and incorporating the printed circuit board into a rotary device, according to an illustrative embodiment of the disclosure. The method 700 may begin at block 705. At block 705, a flexible PCB base or substrate layer may be provided. The base layer may be formed from a wide variety of suitable materials as described above with reference to FIG. 1. Additionally, the base layer may include any suitable number of sections.

At block 710, windings or other suitable conductive elements may be formed or positioned on the base layer. A wide variety of suitable methods or techniques may be utilized to form or position conductive elements on the base layer. For example, conductive elements may be deposited, formed via additive manufacturing, etched from a conductive layer, welded, heat fused, adhered, or otherwise joined to a base layer. Additionally, any suitable configuration of conductive elements may be formed as desired. For example, conductors may be formed in a desired winding pattern.

At block 715, a determination may be made as to whether one or more additional layers are necessary for the PCB. For example, a determination may be made as to whether additional base layers are required in order to form or provide additional conductive elements. In the event that a winding pattern or other conductive element arrangement is distributed among a plurality of base layers (e.g., different phase windings formed on different layers, etc.), then it may be determined that additional layers are necessary. As another example, a determination may be made as to whether a topcoat or other sandwiching layer should be formed. If it is determined at block 715 that one or more additional layers are necessary or desired, then operations may continue at block 705, and an additional layer (e.g., an additional base layer, etc.) may be provided. In this regard, conductive elements may be formed on any number of base layers and/or topcoats or sandwiching layers may be formed as desired. If, however, it is determined at block 715 that no additional layers are required or necessary, then operations may continue at block 720.

At block 720, which may be optional in certain embodiments, gaps or holes may be formed through the PCB. For example, gaps may be formed through the base layer(s) of the PCB between the conductive elements formed on the base layer(s). The gaps may permit teeth of a motor component (e.g., teeth formed on a laminated slot structure, etc.) to extend at least partially through the PCB when conductive elements are aligned in slots of the motor component. As an alternative to forming gaps after conductive elements have been formed, gaps may be formed through one or more base layers prior to the formation or positioning of conductive elements.

At block 725, the PCB may be wrapped, curled, folded, or otherwise manipulated in order to be incorporated into a motor component, such as a stator assembly or a rotor assembly. In certain embodiments, the PCB may be wrapped or otherwise manipulated around a laminated structure or laminated core of a motor component. For example, at block 730, the PCB may be wrapped around or curled inside a preformed laminated structure. As another example, at block 735, the PCB may be aligned with a flexible laminated structure (e.g., a foldable stator structure, a foldable rotor structure, etc.), and the PCB and the laminated structure may be rolled or curled together. At block 730, the laminated structure and the PCB may be incorporated into a motor assembly. For example, the laminated structure and the PCB may be incorporated into a stator assembly or a rotor assembly of a rotary motor device. Operations may end following block 730.

Conditional language, such as, among others, "can," "could," "might," or "may," unless specifically stated otherwise, or otherwise understood within the context as used, is generally intended to convey that certain embodiments could include, while other embodiments do not include, certain features, elements, and/or operations. Thus, such conditional language is not generally intended to imply that features, elements, and/or operations are in any way required for one or more embodiments or that one or more embodiments necessarily include logic for deciding, with or without user input or prompting, whether these features, elements, and/or operations are included or are to be performed in any particular embodiment.

Many modifications and other embodiments of the disclosure set forth herein will be apparent having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A motor comprising:
    a stator; and
    a rotor co-radially arranged with the stator and configured to rotate relative to the stator assembly,
    wherein the stator comprises:
        a laminated structure comprising a plurality of slots defined by a plurality of teeth extending from a surface of the laminated structure; and
        a flexible printed circuit board comprising:
            a base layer, wherein a plurality of gaps are formed entirely through the base layer and each of the plurality of teeth extends through a respective one of the plurality of gaps; and
            a plurality of conductive windings formed on the base layer, wherein each of the plurality of conductive windings comprises a respective portion that is positioned in a respective one of the plurality of slots.

2. The motor of claim 1, wherein the flexible printed circuit board comprises a bend radius of twenty inches or smaller.

3. The motor of claim 1, wherein the base layer comprises at least one of polyimide, polyamide imide, polyester, polyethylene napthalate, or polyetherimide.

4. The motor of claim 1, wherein the base layer comprises a plurality of sections.

5. The motor of claim 4, wherein adjacent sections in the plurality of sections are connected via physical attachment components.

6. The motor of claim 1, wherein a first portion of the plurality of conductive windings are formed on a first surface of the base layer and a second portion of the plurality of conductive windings are formed on a second surface of the base layer.

7. The motor of claim 1, wherein:
    the base layer comprises a first base layer and a first portion of the plurality of conductive windings are formed on the first base layer,
    the printed circuit board comprises a second base layer formed over the first portion of the plurality of conductive windings and a second portion of the plurality of conductive windings are formed on the second base layer, and
    the plurality of gaps are formed entirely through both the first base layer and the second base layer.

8. The motor of claim 1, wherein the respective portion of each of the plurality of conductive windings is positioned parallel to the respective one of the plurality of slots in which the respective portion is positioned.

9. The motor of claim 1, wherein the plurality of conductive windings comprise at least one of a metallic material, a metallic alloy, a bimetal, or carbon nanotubes.

10. The motor of claim 1, wherein the plurality of conductive windings comprises one of (i) a single phase winding or (ii) a three-phase winding.

11. A motor comprising:
    a stator; and;
    a rotor co-radially arranged with the stator and configured to rotate relative to the stator along an axis of rotation, wherein both the stator and the rotor are present within a plane that is perpendicular to the axis of rotation, wherein the stator comprises a laminated structure comprising a plurality of slots defined by a plurality of teeth extending from a surface of the laminated structure; and
    a flexible printed circuit board comprising:
        a base layer, wherein a plurality of gaps are formed entirely through the base layer and each of the plurality of teeth extends through a respective one of the plurality of gaps; and
        a plurality of conductive windings formed on the base layer, wherein each of the plurality of conductive windings comprises a respective portion that is positioned in a respective one of the plurality of slots such that the portion is parallel to the respective slot.

12. The motor of claim 11, wherein the flexible printed circuit board comprises a bend radius of twenty inches or smaller.

13. The motor of claim 11, wherein the base layer comprises at least one of polyimide, polyamide imide, polyester, polyethylene napthalate, or polyetherimide.

14. The motor of claim 11, wherein the base layer comprises a plurality of sections.

15. The motor of claim 11, wherein a first portion of the plurality of conductive windings are formed on a first surface of the base layer and a second portion of the plurality of conductive windings are formed on a second surface of the base layer.

16. The motor of claim 11, wherein:

the base layer comprises a first base layer and a first portion of the plurality of conductive windings are formed on the first base layer, the printed circuit board comprises a second base layer formed over the first portion of the plurality of conductive windings and a second portion of the plurality of conductive windings are formed on the second base layer, and the plurality of gaps are formed entirely through both the first base layer and the second base layer.

17. The motor of claim 11, wherein the plurality of conductive windings comprise at least one of a metallic material, a metallic alloy, a bimetal, or carbon nanotubes.

18. The motor of claim 11, wherein the plurality of conductive windings comprises one of (i) a single phase winding or (ii) a three-phase winding.

* * * * *